United States Patent [19]

Maekawa

[11] Patent Number: 5,128,974
[45] Date of Patent: Jul. 7, 1992

[54] SHIFT REGISTER APPARATUS WITH IMPROVED CLOCK SUPPLY

[75] Inventor: Toshikazu Maekawa, Kanagawa, Japan

[73] Assignee: Sony Corporation, Japan

[21] Appl. No.: 604,446

[22] Filed: Oct. 29, 1990

[30] Foreign Application Priority Data

Nov. 2, 1989 [JP] Japan .................. 1-284691

[51] Int. Cl.⁵ .............. G11C 11/40; G11C 19/28; H03K 23/44
[52] U.S. Cl. ...................... 377/81; 377/78; 377/79; 377/117
[58] Field of Search ............. 377/77, 78, 79, 81, 377/117, 121

[56] References Cited

U.S. PATENT DOCUMENTS

| | | | |
|---|---|---|---|
| 3,573,498 | 4/1971 | Ahrons | 377/79 |
| 3,683,203 | 8/1972 | Smith | 377/79 |
| 3,993,916 | 11/1976 | Copeland et al. | 377/79 |
| 4,224,531 | 9/1980 | Ebihara et al. | 377/79 |
| 4,484,087 | 11/1984 | Mazin et al. | 377/79 |

OTHER PUBLICATIONS

IBM Tech. Discl. Bul. vol. 13 No. 5 Oct. 1970 pp. 1349 1350; "Noncomplementary Static Shift Register" By Gaensslen & Krick.

*Primary Examiner*—John S. Heyman
*Attorney, Agent, or Firm*—Ronald P. Kananen

[57] ABSTRACT

A shift register apparatus comprising unit registers, clocks and gates. Only when data input to the apparatus is significant enough to shift the state of the unit registers, is the clock signal supplied selectively to the unit register of the applicable stage. The selective supplying of the clock signal reduces the power fed to clock lines. With a larger number of shift stages, a greater amount of power will be saved, especially in applications where the apparatus is used to generate multiphase pulses. Fewer drivers are needed to drive the clock signal, which may be supplied at the TTL level.

9 Claims, 12 Drawing Sheets

SHIFT REGISTER APPARATUS WITH IMPROVED CLOCK SUPPLY

BACKGROUND OF THE INVENTION

1. Field of the Invention

The present invention relates to a shift register apparatus and, more particularly, to a CMOS-based shift register apparatus that consumes less power.

2. Description of the Prior Art

Figure 1:
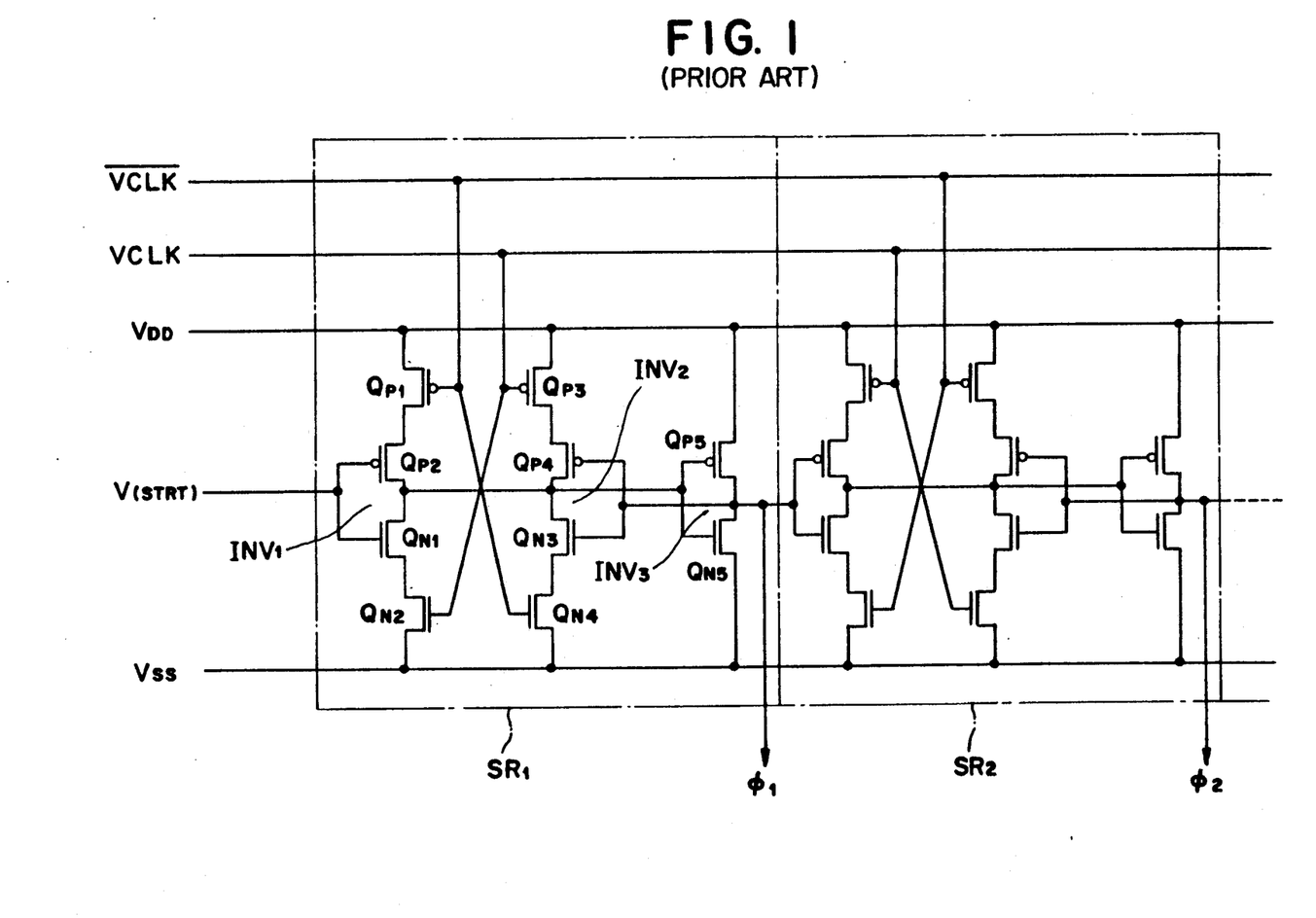
FIG. 1 is a circuit diagram of the typical prior art shift register.

FIG. 1 depicts the construction of a prior art shift register that incorporates CMOSs. In FIG. 1, reference characters $Q_{P1}$-$Q_{P5}$ designate P-type field effect transistors (FETs) and $Q_{N1}$-$Q_{N5}$ denote N-type FETs.

Each of shift registers $SR_1$, $SR_2$, etc. ($SR_3$ and on omitted from the figure) in different stages comprises a first clocked inverter $INV_1$ made up of FETs $Q_{P1}$, $Q_{P2}$, $Q_{N1}$ and $Q_{N2}$; a second clocked inverter $INV_2$ for latching the output of the clock inverter $INV_1$; and a third inverter $INV_3$. The second clocked inverter $INV_2$ contains FETs $Q_{P3}$, $Q_{P4}$, $Q_{N3}$ and $Q_{N4}$, while the third clocked inverter $INV_3$ comprises FETs $Q_{P5}$ and $Q_{N5}$.

Figure 2:
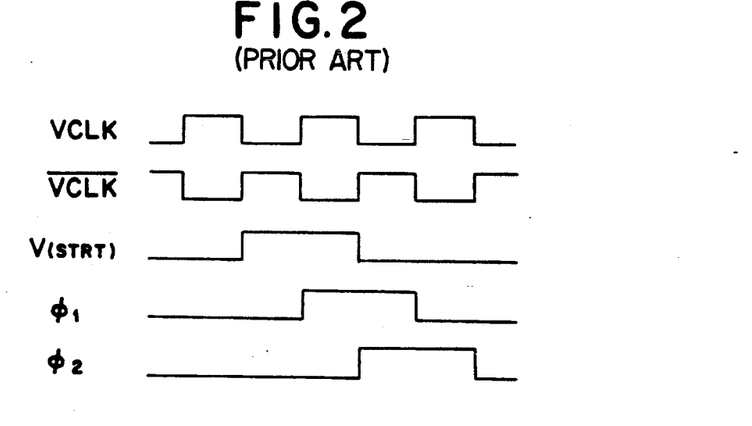
FIG. 2 is a timing chart associated with the prior art shift register.

How this prior art shift register works will now be described with reference to FIG. 2. An input signal $V_{(STRT)}$ supplied to the unit register $SR_1$ is raised as shown in FIG. 2. When a clock signal VCLK is raised and a complementary clock signal $\overline{VCLK}$ is lowered at the next timing pulse, the output of the first clocked inverter $INV_1$ is brought Low. This output is input to the third inverter $INV_3$.

Thus the output $\phi_1$ of the first stage unit register $SR_1$, i.e., the output of the third inverter $INV_3$, is brought High, which is the same level as that of the input signal $V_{(STRT)}$.

The output of the third inverter $INV_3$ is also supplied to the input of the second clocked inverter $INV_2$. When the clock signal VCLK is inverted, the second clocked inverter $INV_2$ is activated, latching the output signal $\phi_1$ in conjunction with the third inverter $INV_3$.

At this point, the second stage unit register $SR_2$ reads the output $\phi_1$ of the first stage unit register $SR_1$, whereby the output $\phi_2$ of the second stage unit register $SR_2$ is brought High.

When the clock signal VCLK is again raised, the already lowered input signal $V_{(STRT)}$ is read, and the output $\phi_1$ is brought Low.

With the above process repeated, the input signal $V_{(STRT)}$ is transferred to the third and fourth stage unit registers $SR_3$ and $SR_4$, yielding outputs $\phi_3$ and $\phi_4$.

The prior art shift register of the above-described construction is illustratively used in a liquid crystal display (LCD) scanner to generate horizontal sampling pulses. An example of such use will now be described.

Figure 3:
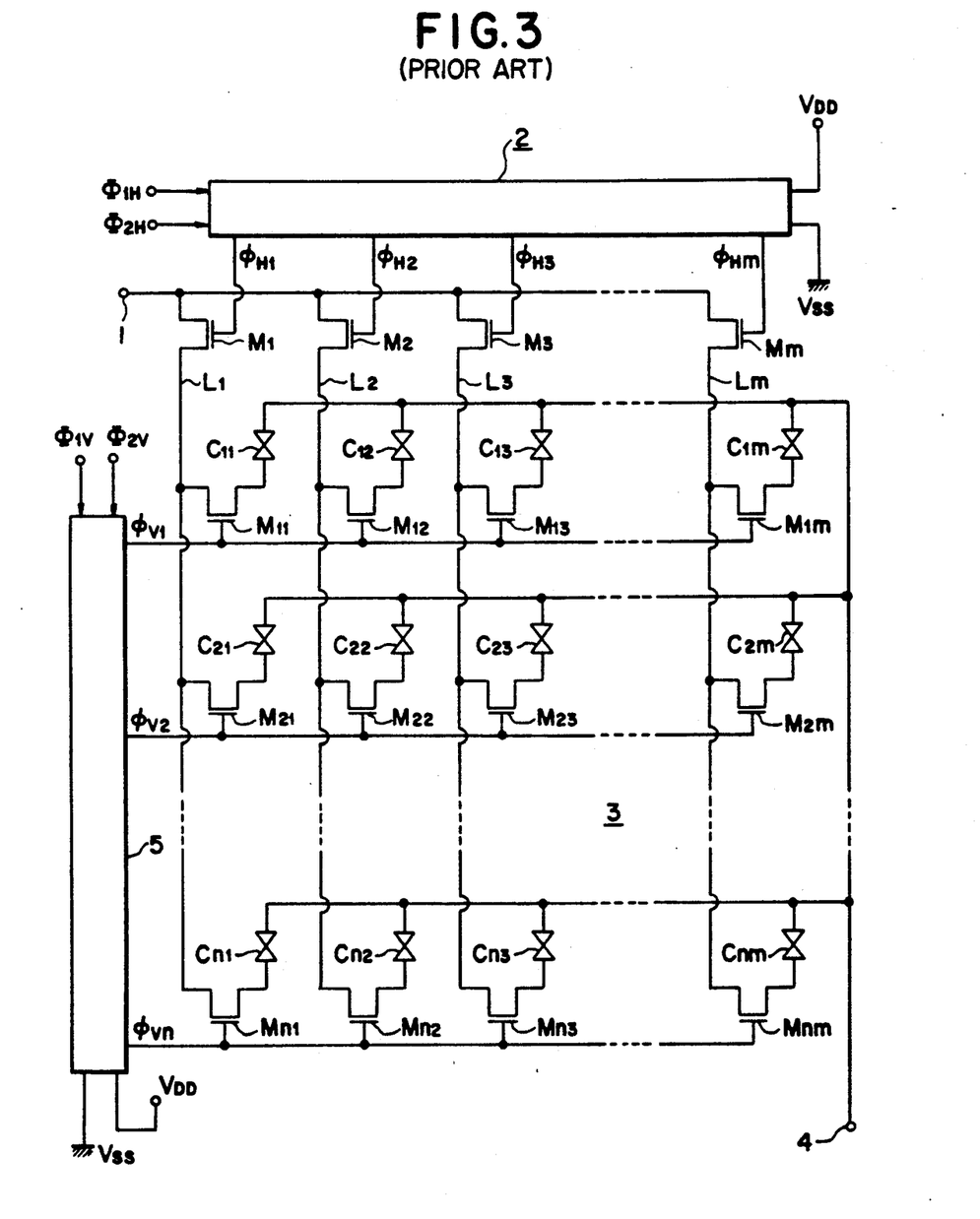
FIGS. 3 and 4A-E are views describing a liquid crystal display (LCD) to which the shift register according to the prior art is applied.

In FIG. 3, reference numeral 1 is an input terminal through which a TV video signal is supplied. Past the input signal 1, the video signal is supplied to vertical lines $L_1, L_2, \ldots L_m$ through switching elements $M_1, M_2, \ldots M_m$ (horizontal switches) each illustratively comprising an N-channel FET. The value "m" represents the number of pixels in the horizontal direction. Furthermore, an m-stage shift register 2 is provided to constitute a horizontal scanning circuit. The shift register 2 is supplied with clock signals $\phi_{1H}$ and $\phi_{2H}$ which are "m" times the horizontal frequency. These clock signals consecutively scan driving pulse signals $\phi_{H1}$, $\phi_{H2}, \ldots \phi_{Hm}$ that are output from the output terminals of the shift register 2, the driving pulse signals being supplied to each control terminal of the switching elements $M_1$-$M_m$. Meanwhile, the shift register 2 is supplied with a low potential ($V_{SS}$) and a high potential ($V_{DD}$). These two kinds of potential are used to generate driving pulses of two potential levels.

Each of the lines $L_1$-$L_m$ is connected to one end of each of switching elements $M_{11}$, $M_{21}, \ldots M_{n1}$, $M_{12}$, $M_{22}, \ldots M_{n2}, \ldots M_{1m}$, $M_{2m}, \ldots M_{nm}$ (pixel switches). The value "n" represents the number of horizontal scanning lines. The other end of each of the switching elements $M_{11}$-$M_{nm}$ is connected to a target terminal 4 via liquid crystal cells $C_{11}$, $C_{21}, \ldots C_{nm}$.

An n-stage shift register 5 is further provided to constitute a vertical scanning circuit. The shift register 5 is supplied with horizontal frequency clock signals $\phi_{1v}$ and $\phi_{2v}$. These clock signals consecutively scan driving pulse signals $\phi_{v2}$, $\phi_{v2}, \ldots \phi_{vn}$ which are output from output terminals of the shift register 5. The driving pulse signals are supplied to the control terminal representing each horizontal line ($M_{11}$-$M_{1m}$), ($M_{21}$-$M_{2m}$), $\ldots$ ($M_{n1}$-$M_{nm}$) of the switching elements $M_{11}$-$M_{nm}$ making up a matrix 3. Like the shift register 3, the shift register 5 is also supplied with $V_{SS}$ and $V_{DD}$.

Figure 4A:
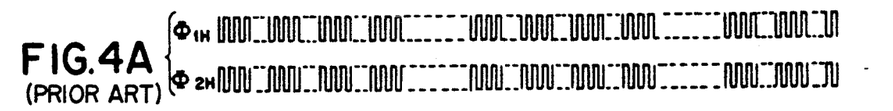
Figure 4B:
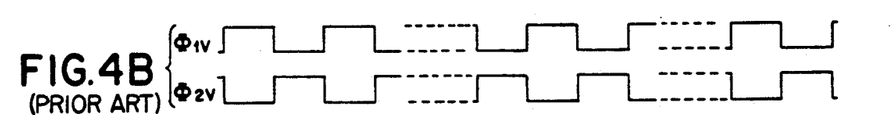
Figure 4C:
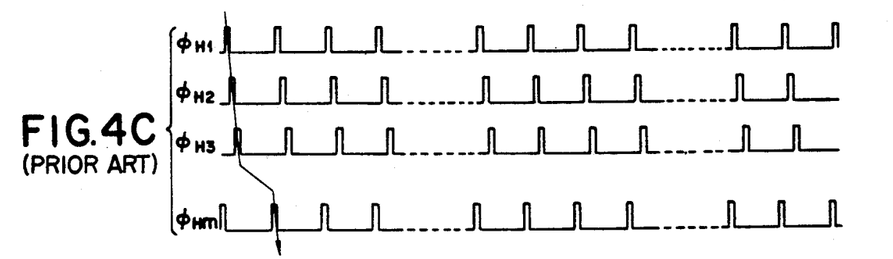
Figure 4D:
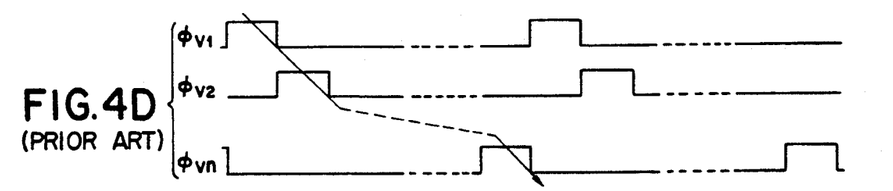

In the above circuit, the shift registers 2 and 5 are supplied with clock signals $\phi_{1H}$, $\phi_{2H}$, $\phi_{1V}$ and $\phi_{2V}$ shown in FIGS. 4(A) and 4(B). The shift register 2 outputs signals $\phi_{H1}$-$\phi_{Hm}$ per pixel cycle, as depicted in FIG. 4(C), and the shift register 5 outputs signals $\phi_{v1}$-$\phi_{vn}$ per horizontal cycle, as illustrated in FIG. 4 (D). The input terminal 1 is fed with a signal shown in FIG. 4(E).

While the signals $\phi_{V1}$-$\phi_{H1}$ are being output, the switching elements $M_1$, $M_{11}$-$M_{1m}$ are turned on. This creates a current path comprised of the input terminal 1, $M_1$, $L_1$, $M_{11}$, $C_{11}$ and target terminal 4. The liquid crystal cell $C_{11}$ is supplied through this current path with a potential difference between the signal fed to the input terminal 1 and the target terminal 4. Therefore, the cell $C_{11}$, within its capacity, samples and holds the charge equivalent to the potential difference caused by the signal of the first pixel. The light transmittance of the liquid crystal is varied depending on the amount of the charge in the cell. The same operation is performed consecutively with the cells $C_{12}$-$C_{nm}$. When the signal of the next field is supplied, the amount of the charge in each of the cells $C_{11}$-$C_{nm}$ is updated.

Figure 4E:
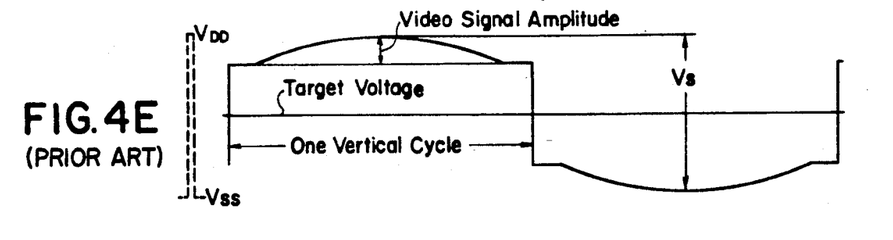

In this manner, the light transmittance of the liquid crystal cells $C_{11}$-$C_{nm}$ is varied with respect to each pixel of the video signal. The process is repeated so as to effect TV image displays.

Where the LCD is used, an AC driving scheme is generally utilized for higher reliability and longer service life thereof. In displaying TV images, the video signal is illustratively inverted per field or per frame before being input to the input terminal 1. That is, as shown in FIG. 4(E), the input terminal 1 is supplied with a signal that is inverted per field or per frame.

In the above-described prior art shift register setup, the lines of the clock signals VCLK and $\overline{VCLK}$ are loaded with the unit registers $SR_1$-$SR_n$ in a plurality of stages. This results in a significantly large capacity requirement for the shift register.

Figure 5:
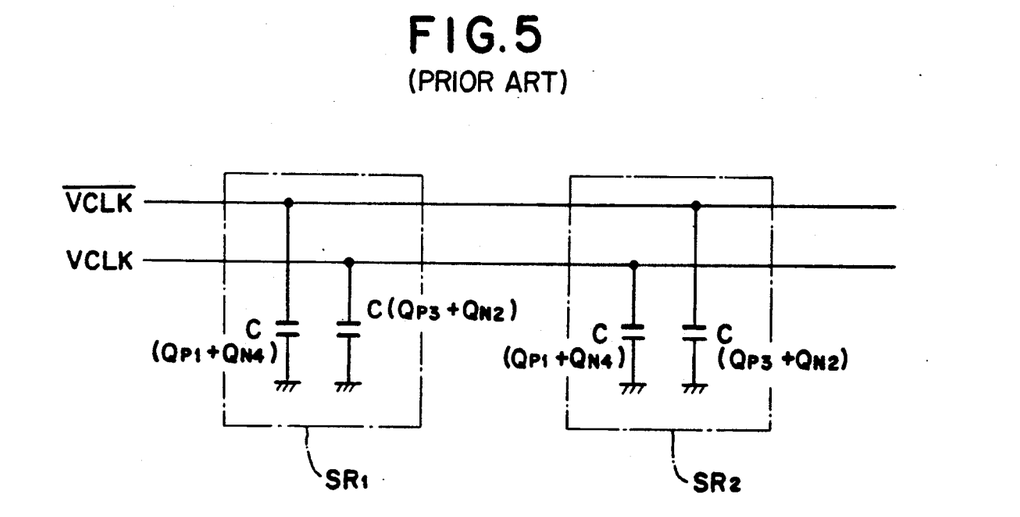
FIG. 5 is a view depicting how the clock lines of the prior art shift register are loaded in terms of capacity.

As illustrated in FIG. 5, the line of the clock signal VCLK receives the sum of the gate capacities ($Q_{P3}$+$Q_{N2}$) of the FETs $Q_{P3}$ and $Q_{N2}$, and the line of the clock signal $\overline{VCLK}$ receives the sum of the gate capacities ($Q_{P1}$+$Q_{N4}$) of the FETs $Q_{P1}$ and $Q_{N4}$.

For example, if an MOS transistor gate arrangement measures 7 μm in length and 50 μm in width and if the gate layer thereof is 500 Å thick, the required capacity is 0.49 pF. If the number of shift register stages is 400, the capacity required of each clock line is about 200 pF.

If the output width (A) of a clock signal is 12 volts and the frequency (f) thereof is 3.8 MHz, the power (P) consumed is calculated as follows:

$$P = CA^2 f = 200 \times 10^{-12} \times 144 \times 3.8 \times 10^6 \approx 109 \text{ mW}$$

This means that each clock line consumes 109 mW. Thus one disadvantage of the prior art shift register apparatus is its high power consumption level. Another disadvantage is that a low-impedance large-output clock signal source is needed to drive the prior art shift register apparatus.

More specifically, a liquid crystal view finder containing such shift registers and incorporated for monitoring purposes in a portable TV camera poses an impediment to reducing the power consumption level of the camera as a whole.

SUMMARY OF THE INVENTION

It is therefore an object of the present invention to provide a shift register apparatus in which clock signals are selectively given to unit registers whose status is individually inverted by a significant signal, thereby reducing the capacity load on the clock lines and achieving lower power consumption.

Figure 6:
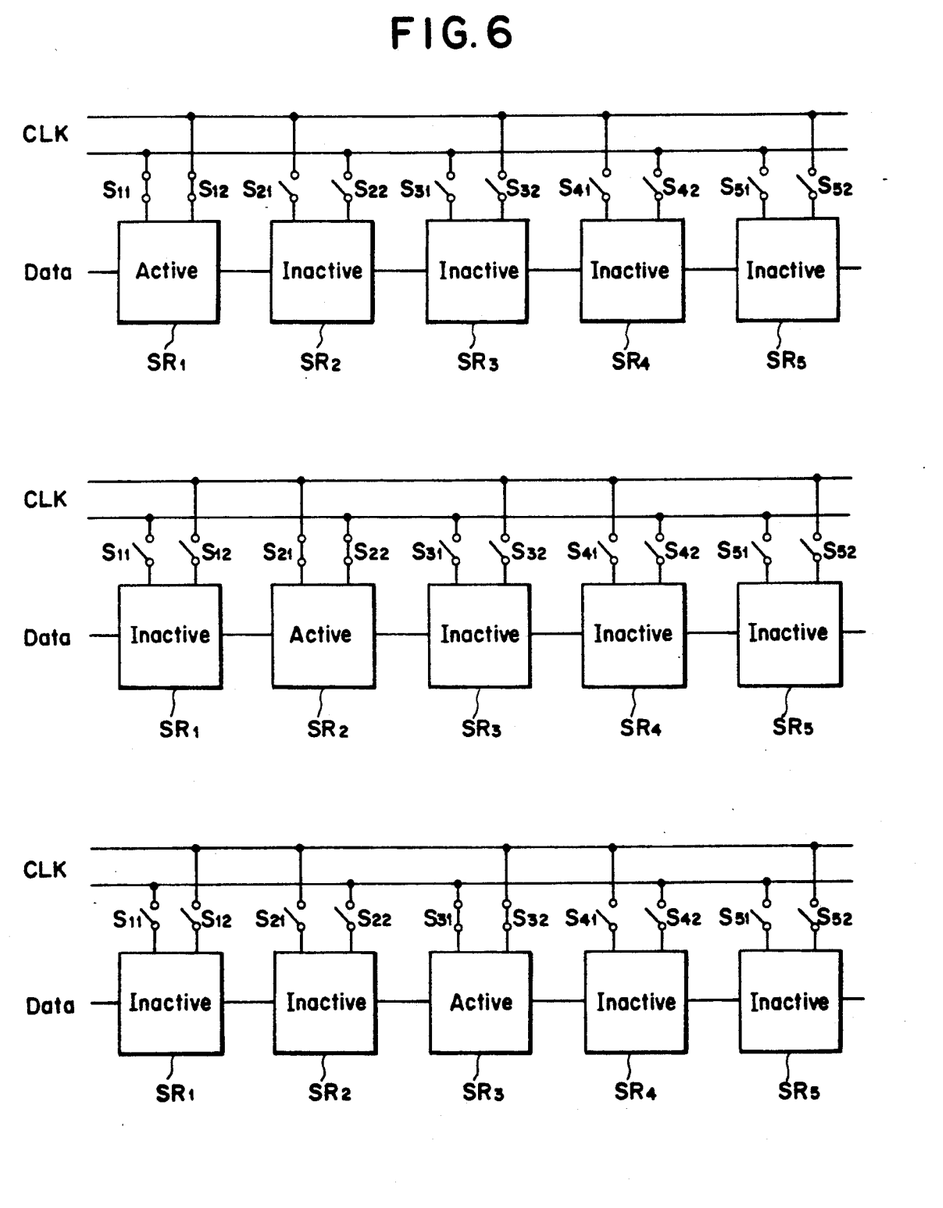
FIG. 6 is a conceptual view of a first embodiment of the invention.

In carrying out the invention, there is provided a shift register apparatus whose construction is outlined in FIG. 6. In FIG. 6, reference characters $SR_1$, $SR_2$, $SR_3$, etc. designate unit registers that are consecutively connected to constitute the shift register apparatus. Each of the unit registers $SR_1$-$SR_5$ receives clock signals VCLK and $\overline{VCLK}$ over clock lines via switches $S_1$ and $S_2$.

Each of the switches $S_1$ and $S_2$ is closed when the data input to each of the unit registers $SR_1$, $SR_2$, etc. is brought illustratively High. That is, when a single piece of input signal data is input, the High level signal is supplied to only the unit register $SR_1$ at the first timing pulse, as depicted in FIG. 6 (A). This causes the switching circuits $S_{11}$-$S_{12}$ to be closed and the other switches $S_{21}$, $S_{22}$, $S_{31}$ and $S_{32}$ to be opened.

When the input to the unit transistor $SR_2$ is brought High at the next timing pulse, the switches $S_{21}$ and $S_{22}$ are closed and the other switches are opened. At the next timing pulse, the switches $S_{31}$ and $S_{32}$ are closed and the other switches are opened, and so on.

In this manner, in the shift register apparatus according to the invention, when the data to be transmitted reaches a level of significance, clock signals are selectively supplied only to the unit register in the applicable stage.

DESCRIPTION OF THE PREFERRED EMBODIMENTS

Figure 7:
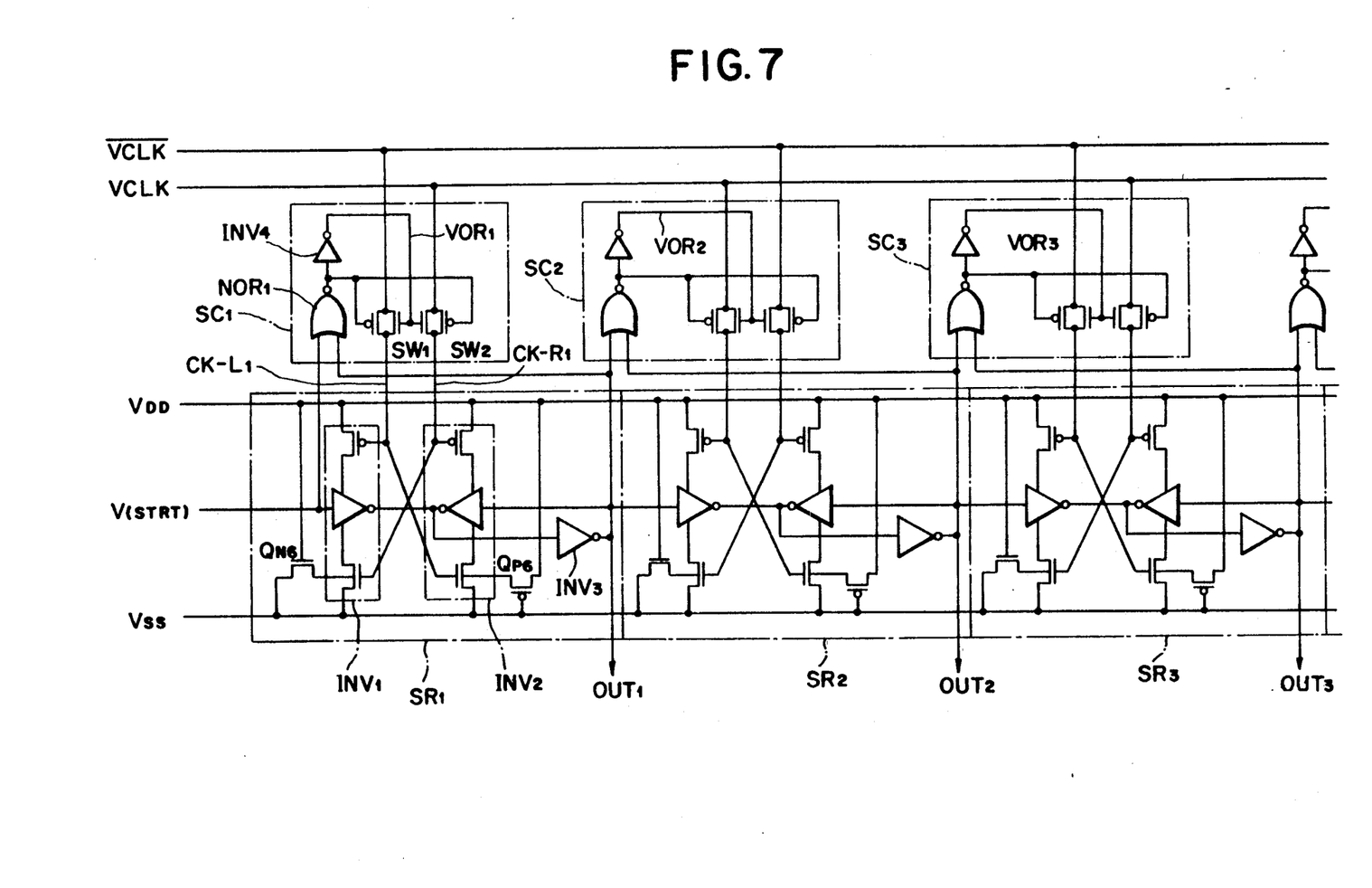
FIG. 7 is a circuit diagram of the first embodiment.

FIG. 7 is a circuit diagram of the first embodiment of the invention. In FIG. 7, a unit register $SR_1$ comprises a first clocked inverter $INV_1$, a second clocked inverter $INV_2$ and a third clocked inverter $INV_3$. A clock switching circuit $SC_1$ turns off clock signals VCLK and $\overline{VCLK}$ when neither the input nor the output to and from the first stage unit register $SR_1$ is a High level signal, i.e., when the input and output are not a significant signal each.

The other unit registers $SR_2$, $SR_3$, etc. are of the same construction, and any repetitive description thereof is omitted.

In the clock switching circuit $SC_1$, a signal $V_{(STRT)}$ that is input to the unit register $SR_1$ and a signal $OUT_1$ that is the output therefrom are input to a NOR gate $NOR_1$. The output from the NOR gate $NOR_1$ and an inverted output obtained by having an inverter $INV_4$ for inverting the NOR gate output are used to turn on and off a pair of different conductive transfer gates $SW_1$ and $SW_2$ connected in parallel.

How the shift register according to the invention works will now be described with reference to the timing chart of FIG. 8. At a point in time $t_0$, the input signal $V_{(STRT)}$ and output signal $OUT_1$ are both Low, the output of the NOR gate $NOR_1$ is High, and the output $VOR_1$ of the inverter $INV_4$ is low. Thus the transfer gates $SW_1$ and $SW_2$ are turned off. In this state, the clock signals VCLK and $\overline{VCLK}$ are not supplied to the unit register $SR_1$.

Figure 8:
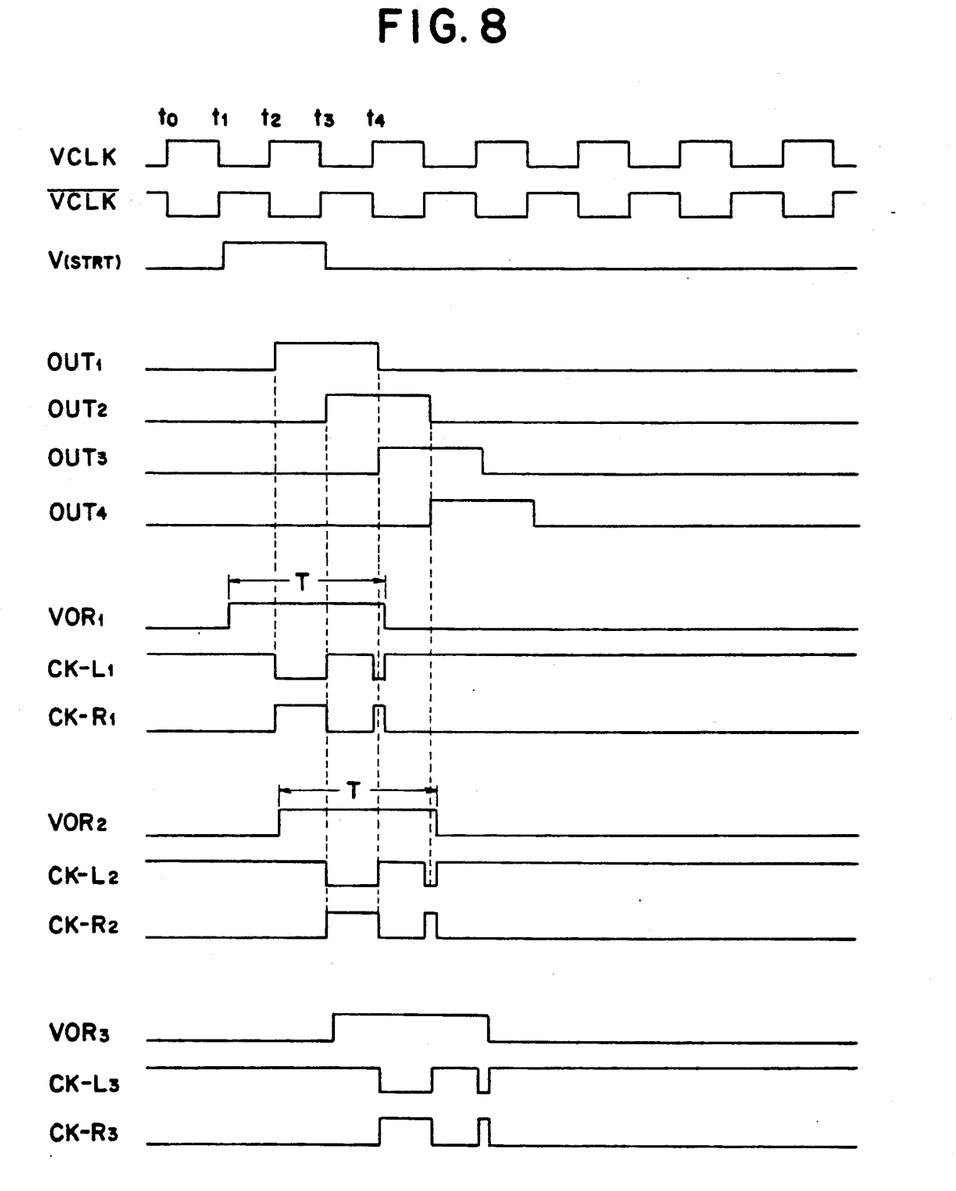
FIG. 8 is a timing chart associated with the first embodiment of FIG. 7.

When the input signal $V_{(STRT)}$ is raised and brought High at a point in time $t_1$, as shown in FIG. 8, one of the inputs to the NOR gates $NOR_1$ is brought High, and the output therefrom is brought Low. The output and an inverted High level output $VOR_1$ obtained by having the inverter $INV_4$ invert that output are supplied to the transfer gates $SW_1$ and $SW_2$, turning both gates on. When the clock signal VCLK is brought High in this state, signals $CK$-$L_1$ and $CK$-$R_1$ are supplied to the unit register $SR_1$ at a point in time $t_2$, with the clock signal supplied to the unit register $SR_1$ and the output $OUT_1$ therefrom brought High.

When the clock signal is Low at a point in time $t_3$, the third inverter $INV_3$ and the second clocked inverter $INV_2$ are used to latch the High level of the output signal $OUT_1$, as described above. The transfer gates $SW_1$ and $SW_2$ are left turned on. When the output $OUT_1$ is brought High at the time $t_2$, the second stage unit register $SR_2$ is supplied with the clock signal via the clock switching $SC_2$ and is activated thereby.

At the next point in time $t_4$, the input signal $V_{(STRT)}$ is brought Low before the clock signal VCLK is brought High. Thus when the clock signal VCLK is brought High at the time $t_4$, the unit register $SR_1$ reads the Low level to bring its output $OUT_1$ Low.

When the output $OUT_1$ is brought Low, the input and output to and from the unit register $SR_1$ are also brought Low. This immediately causes the transfer gates $SW_1$ and $SW_2$ to be turned off, thereby preventing the clock signals VCLK and $\overline{VCLK}$ from getting supplied to the unit register $SR_1$.

The time T during which the transfer gates $SW_1$ and $SW_2$ are turned on includes, as the output $VOR_1$ of the inverter $INV_4$ indicates in FIG. 8, an operation delay time during which the output $OUT_1$ of the unit register $SR_1$ is lowered and an operation delay time during which the clock switching $SC_1$ has yet to act.

Therefore, the clock signals VCLK and $\overline{VCLK}$ that passed through the transfer gates $SW_1$ and $SW_2$ have their waveforms shaped in such a way that part of the first half of the second clock pulse has passed there, as indicated by the signals $CK-L_1$ and $CK-R_1$ in FIG. 8.

At the time $t_3$ when the clock signal $\overline{VCLK}$ is raised, the second stage unit register $SR_2$ reads the output $OUT_1$ of the first stage unit register $SR_1$ so as to bring High the output $OUT_2$ thereof.

That is, when the output $OUT_1$ of the unit transistor $SR_1$ is brought High, the input thereto also goes High. At this point, the transfer gates $SW_1$ and $SW_2$ of the clock switching circuit $SC_2$ are turned on so as to supply the unit register $SR_2$ with the clock signals VCLK and $\overline{VCLK}$.

Thereafter, the same operation as with the unit register $SR_1$ is performed consecutively with subsequent unit registers, shifting the input signal $V_{(STRT)}$ sequentially.

Figure 9:
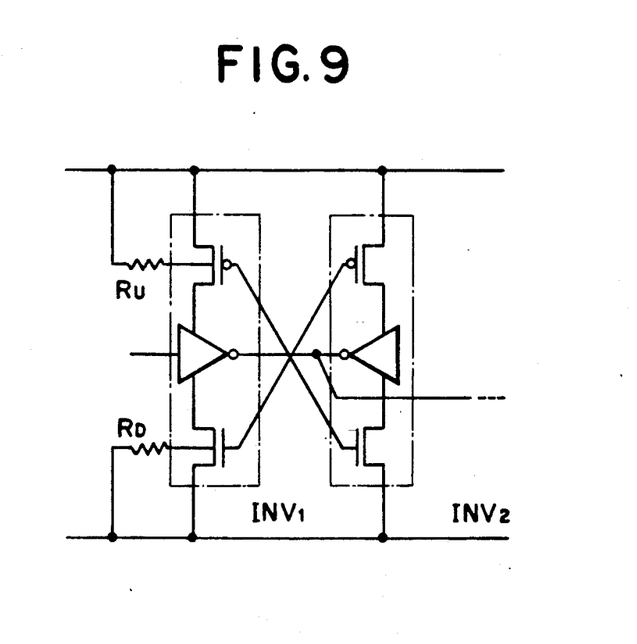
FIG. 9 is a circuit diagram of an alternative pull-up and pull-down means for use with the first embodiment.

FETs $Q_{N6}$ and $Q_{P6}$ attached to the unit register $SR_1$ prevent the first and second clocked inverters $INV_1$ and $INV_2$ from floating when the clock signals VCLK and $\overline{VCLK}$ are not supplied to the unit register $SR_1$. The pull-down FET $Q_{N6}$ and the pull-up FET $Q_{P6}$ keep each unit register in a stable state when the register is not supplied with clock signals. Thus a pull-up resistor $R_U$ and a pull-down resistor $R_D$ may be alternatively used in place of the above pull-up and pull-down FETs, as shown in FIG. 9.

The first embodiment is designed to work when the significant signal is provided on a positive logic basis. If the shift register operates on a negative logic basis, the NOR gate NOR of each clock switching circuit SC need only be replaced with a NAND gate.

Figure 10:
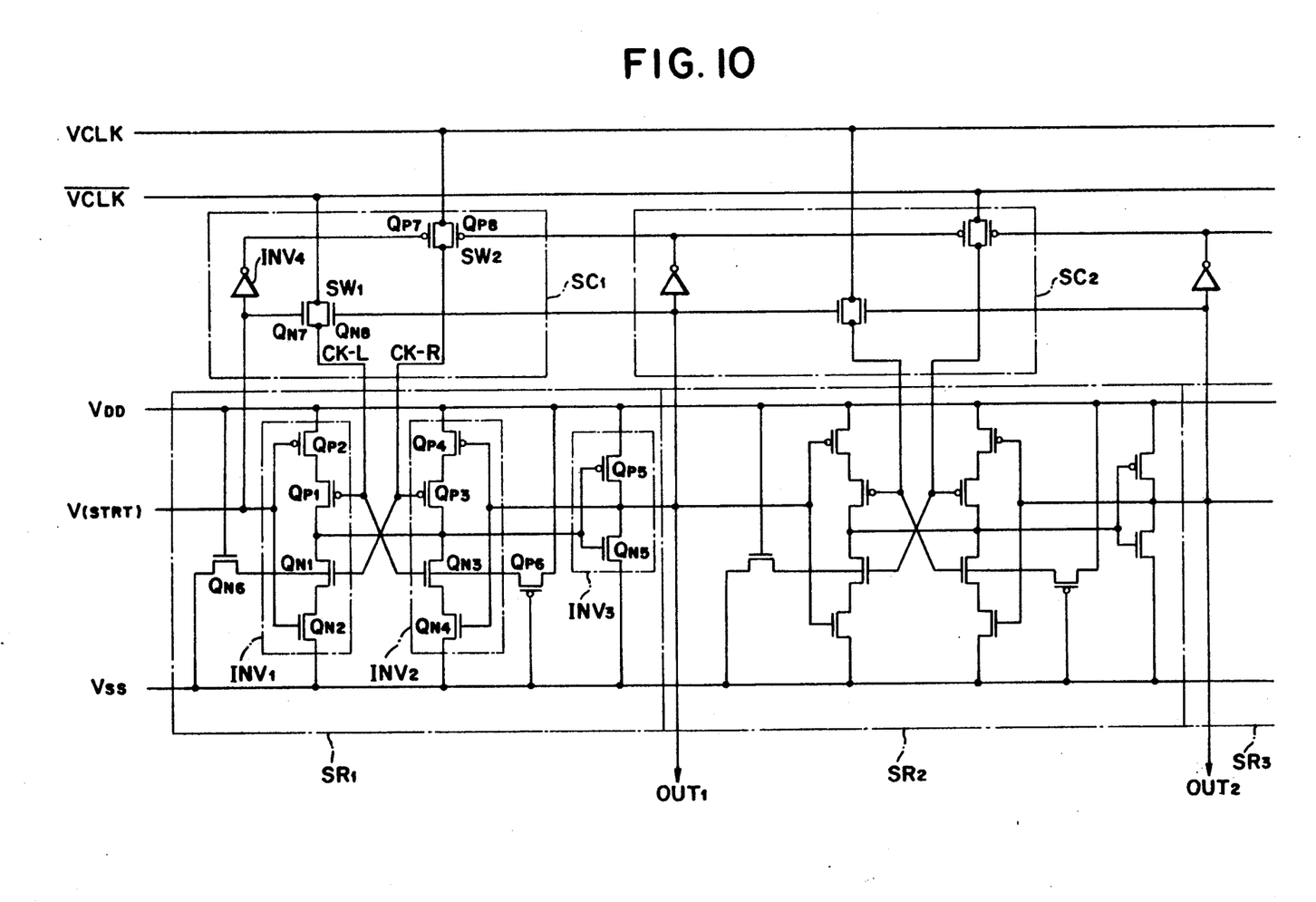
FIG. 10 is a circuit diagram of a second embodiment of the invention.
Figure 11:
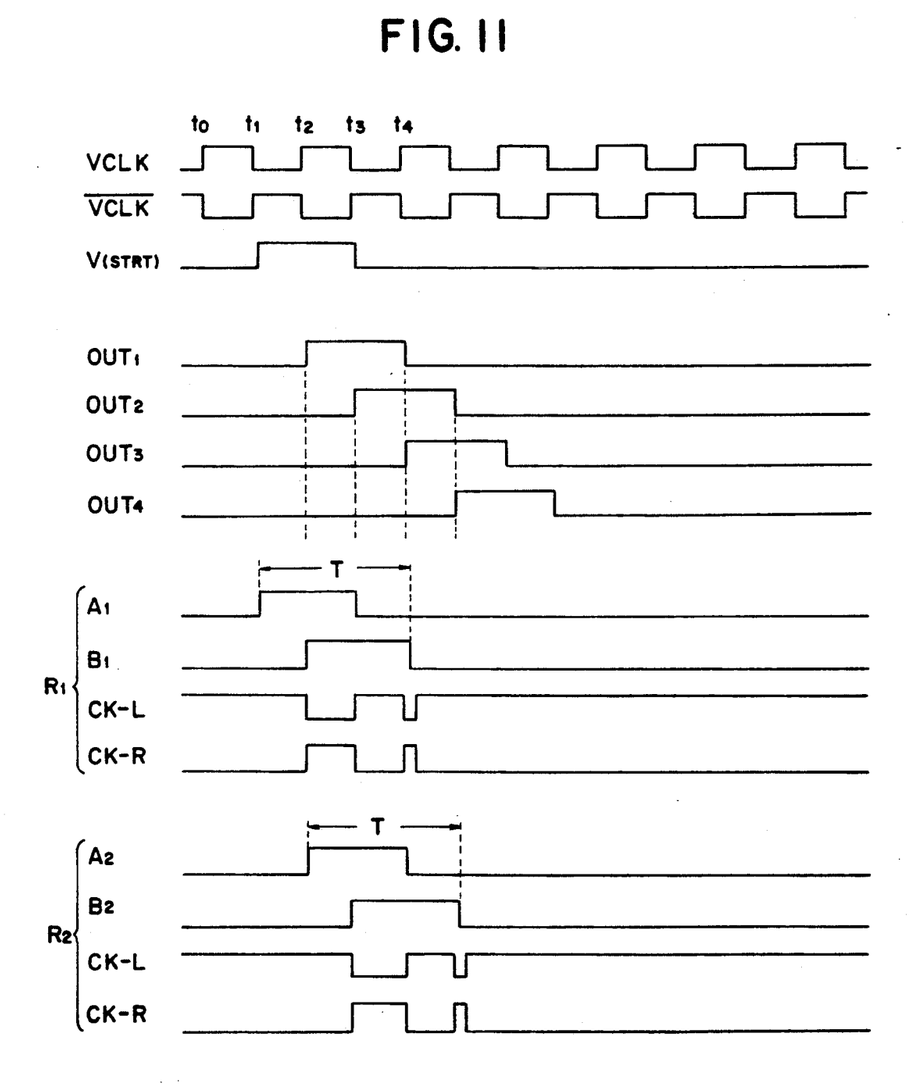
FIG. 11 is a timing chart associated with the second embodiment of FIG. 10.

FIG. 10 is a circuit diagram of the second embodiment of the invention. In FIGS. 7 and 10, like reference characters designate like or corresponding parts. In the second embodiment, the clock switching circuit $SC_1$ ($SC_2$, etc.) contains no logic circuits and has the transfer gates $SW_1$ and $SW_2$ comprised of TFT $Q_{n7}$, $Q_{n8}$, $Q_{p7}$ and $Q_{p8}$ of the same conductive type. The second embodiment is characterized in that the raising point of the input data $V_{(STRT)}$ is latched at a point in time where the clock VCLK is raised and that the falling point of the input data $V_{(STRT)}$ is latched at a point in time where the clock $\overline{VCLK}$ is lowered. As depicted in FIG. 11, the raising of the input signal $V_{(STRT)}$ turns on transistors $Q_{N8}$ and $Q_{P8}$ of the transfer gates $SW_1$ and $SW_2$ (waveform A); when the data of the output $OUT_1$ is lowered, the transistors $Q_{N8}$ and $Q_{P8}$ of the transfer gates $SW_1$ and $SW_2$ are turned off (waveform B).

Therefore, both transfer gates $SW_1$ and $SW_2$ are turned on during the period T. During that time, the clock signals CK-L and CK-R pass, causing the same operation as shown in FIG. 7 to take place.

Logic circuits generally have longer delay times than most inverters. In the second embodiment, the removal of logic circuits contributes to making the operation speed higher.

Figure 12:
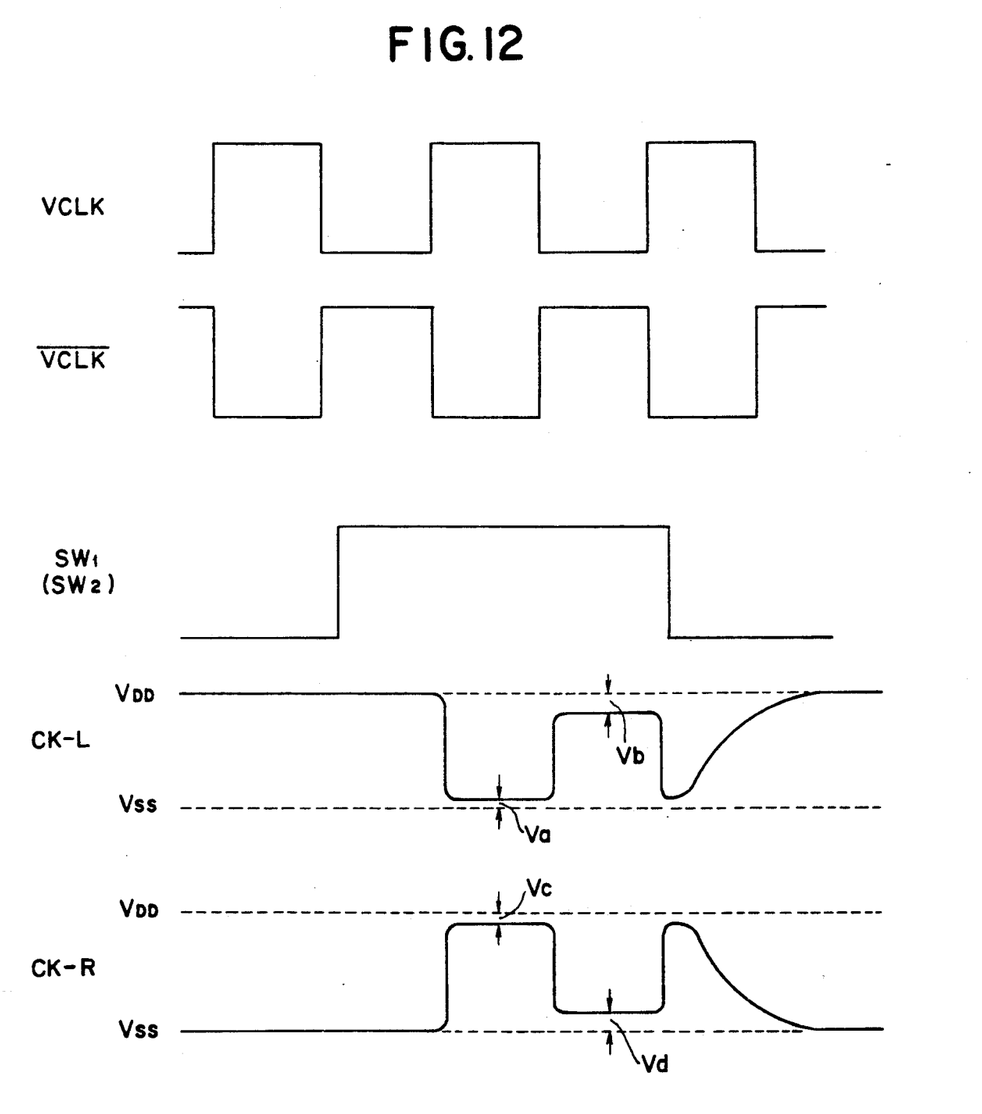
FIG. 12 is a partial enlarged view of some of the signals included in FIG. 11.

In the second embodiment shown in FIG. 10, both transfer gates $SW_1$ and $SW_2$ are made up of TFTs of the same conductive type. Thus the transfer gates $SW_1$ and $SW_2$ have slightly lower voltage levels, i.e., by $V_b$ or by $V_d$, due to the threshold voltage of the TFTs, as illustrated in the enlarged view of FIG. 12. However, the drop in voltage level is not large enough to affect the shift operation. ($V_a$ and $V_c$ each represent a voltage drop caused by currents flowing through the pull-up or pull-down TFT upon power-up. However, the value is small enough to be negligible.)

Figure 13:
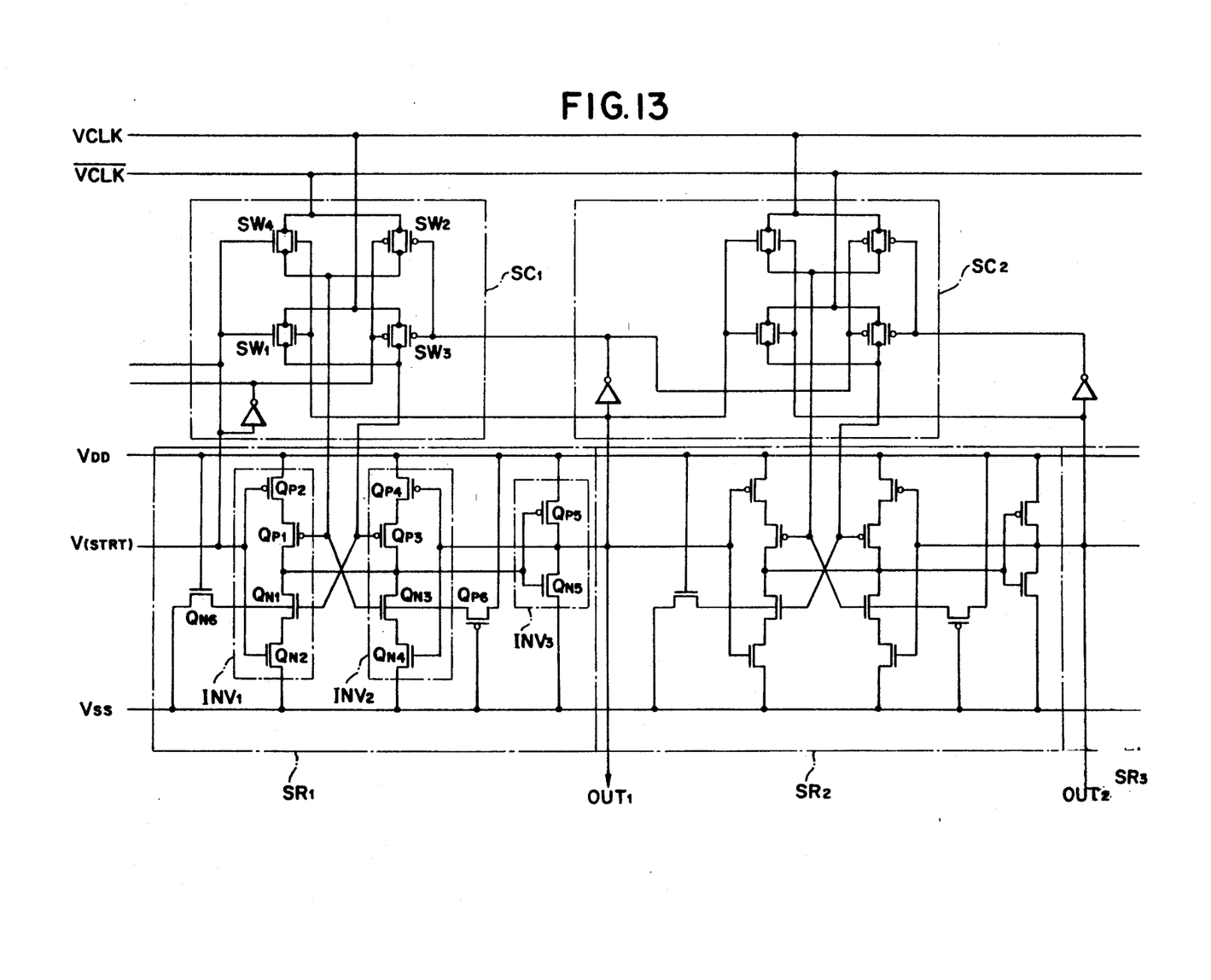
FIG. 13 is a circuit diagram of a third embodiment of the invention.

FIG. 13 is a circuit diagram of the third embodiment. In this embodiment, the transfer gates $SW_1$ and $SW_2$ used in the first embodiment of FIG. 10 are connected in parallel to transfer gates $SW_3$ and $SW_4$ of the respectively reverse conductive types.

In the third embodiment, the clock signals $\overline{VCLK}$ and VCLK are supplied via the parallelly connected complementary transfer gates, $SW_1$ and $SW_3$ in one pair, and $SW_2$ and $SW_4$ in the other. One benefit of this setup is that the positive or negative potential is not affected by the threshold voltage. Another benefit is that the parallel connection further reduces the switch-on resistance involved.

As described, in the shift register apparatus according to the invention, only when the data input to the shift register is significant enough to cause the shift of status in each of the unit transistors, will the clock signal selectively be supplied to the unit register of the applicable stage. This setup drastically reduces the power to be supplied to the clock lines.

The larger the number of shift stages, in such applications as multiphase pulse generators and delay pulse generators in which the shift register is used to generate multiphase pulses, the greater the amount of power saved. The savings in power consumption translate into fewer drivers of clock signals. It is also possible to supply clock signals at the TTL level.

While preferred embodiments of the invention have been described using specific terms, such description is for illustrative purposes only, and it is to be understood that changes and variations may be made without departing from the spirit or scope of the following claims.

What is claimed is:

1. A shift register apparatus comprising:
   a plurality of unit registers which are serially connected, each of said unit registers having an input terminal connected to an output terminal of a preceding unit register and an output terminal connected to an input terminal of a succeeding unit register whereby said unit registers are serially connected;
   clock supplying means for supplying a clock signal to said unit registers, wherein each of said unit registers transfers data obtained from the preceding unit register to the succeeding unit register only when said clock signal is supplied thereto; and
   gating means under control of at least two adjacent unit registers and provided between said unit registers and said clock supplying means, for selectively supplying said clock signal from said clock supplying means to any one or ones of said unit registers, wherein said gating means starts supplying said clock signal to a unit register when the data transfer from the preceding unit register occurs, and ends supplying said clock signal to a unit register when the data transfer to the succeeding unit register occurs.

2. A shift register apparatus according to claim 1, wherein at most two of said unit registers output one of binary data while other remaining said unit registers output the other of binary data.

3. A shift register apparatus according to claim 1, wherein said gating means comprises a plurality of switches each corresponding to each of said unit registers.

4. A shift register apparatus according to claim 3, wherein each of said switches supplies said clock signal to the corresponding unit register in accordance with data at both said input terminal and said output terminal of the corresponding unit register.

5. A shift register apparatus according to claim 4, wherein said gating means prohibits supply of said clock signal to a unit register when data at both said input terminal and said output terminal of the unit register are one of binary data.

6. A shift register apparatus according to claim 5, wherein said one of binary data indicates a high level.

7. A shift register apparatus according to claim 1, wherein each said of said unit registers comprises a first inverter which receives data from said input terminal of said unit register, a second inverter which receives data inverted by said first inverter, and a third inverter which receives data inverted by said second inverter, said first and third inverters operating only when said clock signal is supplied to said unit register.

8. A shift register apparatus according to claim 1, wherein said clock supplying means supplies first and second clock signals which are 180° out of phase with each other.

9. A shift register apparatus comprising:
a plurality of unit registers which are serially connected, each of said unit registers having an input terminal connected to an output terminal of a preceding unit register and an output terminal connected to an input terminal of a succeeding unit register whereby said unit registers are serially connected;

clock supplying means for supplying a clock signal to said unit registers, wherein each of said unit registers transfers data obtained from the preceding unit register to the succeeding unit register only when said clock signal is supplied thereto; and gating means under control of at least two adjacent unit registers and provided between said unit registers and said clock supplying means, for selectively supplying said clock signal from said clock supplying means to at least one of said unit registers, wherein said gating means starts supplying said clock signal to a unit register on or just before the occurrence of data change in a first direction at said input terminal of the unit register, and stops supplying said clock signal to said unit register on or just before the occurrence of data change in a second direction which is opposite to said first direction at said output terminal of the unit register.

* * * * *